(12) United States Patent
Okumura et al.

(10) Patent No.: US 9,164,132 B2
(45) Date of Patent: Oct. 20, 2015

(54) CURRENT SENSOR

(71) Applicant: AISIN SEIKI KABUSHIKI KAISHA, Kariya-shi, Aichi-ken (JP)

(72) Inventors: Ken Okumura, Hekinan (JP); Shigeki Niimi, Kariya (JP); Kenichi Taguch, Toyota (JP); Akira Kamiya, Nagoya (JP)

(73) Assignee: AISIN SEIKI KABUSHIKI KAISHA, Aichi-ken (JP)

( * ) Notice: Subject to any disclaimer, the term of this patent is extended or adjusted under 35 U.S.C. 154(b) by 97 days.

(21) Appl. No.: 14/098,055

(22) Filed: Dec. 5, 2013

(65) Prior Publication Data

US 2014/0176123 A1    Jun. 26, 2014

(30) Foreign Application Priority Data

Dec. 20, 2012    (JP) .................................. 2012-278562

(51) Int. Cl.
| | |
|---|---|
| *G01R 15/20* | (2006.01) |
| *G01R 19/00* | (2006.01) |
| *G01R 5/20* | (2006.01) |
| *G01R 15/18* | (2006.01) |
| *G01B 7/14* | (2006.01) |
| G01R 33/07 | (2006.01) |
| G01R 33/00 | (2006.01) |

(52) U.S. Cl.
CPC .............. *G01R 19/00* (2013.01); *G01R 15/202* (2013.01); *G01R 15/207* (2013.01); *G01R 33/0011* (2013.01); *G01R 33/07* (2013.01)

(58) Field of Classification Search
CPC .. G01R 19/00; G01R 33/0011; G01R 15/202; G01R 33/07
USPC ............ 324/207.2, 76.11, 117 H, 127, 151 A
See application file for complete search history.

(56) References Cited

U.S. PATENT DOCUMENTS

| | | | | |
|---|---|---|---|---|
| 3,845,445 | A * | 10/1974 | Braun et al. ................. | 338/32 H |
| 4,059,798 | A * | 11/1977 | Dierker et al. ................. | 324/127 |
| 5,694,103 | A * | 12/1997 | Goodwin et al. ............. | 336/178 |
| 6,404,180 | B1 * | 6/2002 | Haensgen ................. | 324/117 H |
| 6,426,617 | B1 * | 7/2002 | Haensgen et al. ........ | 324/117 H |
| 6,545,456 | B1 * | 4/2003 | Radosevich et al. ...... | 324/117 H |
| 6,759,840 | B2 * | 7/2004 | Marasch et al. .......... | 324/117 H |

(Continued)

FOREIGN PATENT DOCUMENTS

| | | |
|---|---|---|
| JP | 2009-042003 A | 2/2009 |
| JP | 2010-203910 A | 9/2010 |

*Primary Examiner* — Patrick Assouad
*Assistant Examiner* — Hoang X Nguyen
(74) *Attorney, Agent, or Firm* — Sughrue Mion, PLLC (57) ABSTRACT

A current sensor includes: a core formed by U-shaped flat plates made of a magnetic body and stacked together; a flat plate-like conductor which is inserted on an interior side of a U-groove of the core and through which a current to be measured flows; a detection element which is arranged on the side of an opening of the U-groove in such a way that a detecting direction extends in a spacing direction of the opening, and which detects a strength of a magnetic field; a housing which supports the core, the conductor and the detection element; and a pair of spacing direction supporting portions which are provided at positions along the spacing direction on both sides of the detection element, in an opening-side end of the core, and which abut on the housing.

6 Claims, 7 Drawing Sheets

(56) References Cited

U.S. PATENT DOCUMENTS

| | | | |
|---|---|---|---|
| 7,002,440 B2* | 2/2006 | Attarian et al. | 335/18 |
| 7,193,408 B2* | 3/2007 | Cattaneo et al. | 324/117 R |
| 2003/0227284 A1* | 12/2003 | Marasch et al. | 324/117 H |
| 2003/0227285 A1* | 12/2003 | Marasch et al. | 324/117 R |
| 2005/0237050 A1* | 10/2005 | Itoh | 324/117 R |
| 2006/0043960 A1* | 3/2006 | Itoh et al. | 324/117 R |
| 2009/0039880 A1 | 2/2009 | Nomura et al. | |
| 2010/0259248 A1* | 10/2010 | Labbe | 324/151 R |

* cited by examiner

CURRENT SENSOR

CROSS REFERENCE TO RELATED APPLICATIONS

This application is based on and claims priority under 35 U.S.C. §119 to Japanese Patent Application 2012-278562, filed on Dec. 20, 2012, the entire content of which is incorporated herein by reference.

TECHNICAL FIELD

This disclosure relates to a current sensor which measures a current flowing through a conductor.

BACKGROUND DISCUSSION

Recently, hybrid vehicles and electric vehicles using a motor as a driving source are widely used. In order to control motor output properly, it is important to measure a current flowing through the motor. As a method of measuring such a current, for example, there is a method in which, according to a current flowing through a busbar that connects a DC brushless motor to an inverter, a magnetic field generated around the busbar is magnetically concentrated by a core made of a magnetic body and is detected by a magnetic detection element such as a Hall element, and the current flowing through the busbar is calculated based on the detected magnetic field, for example, as disclosed in JP 2010-203910A (Reference 1) and JP 2009-42003A (Reference 2).

The current sensor disclosed in Reference 1 includes an annular magnetic core with a gap portion provided at a part thereof, and a metal plate provided on the magnetic core and having a shielding effect. The magnetic core and the metal plate are formed by insert molding with a mold resin.

The current sensor disclosed in Reference 2 includes a ring-shaped magnetic concentration core having a gap. The magnetic concentration core is formed by insert molding in a resin case in such a way that the periphery of the gap is exposed to an internal space connecting to an opening.

In the techniques disclosed in References 1 and 2, the core (the magnetic core and the magnetic concentration core are collectively referred to as the "core") is fixed to the case or the like by insert molding. Therefore, a compressive strain is applied to the core according to the compressive stress of the resin, and the hysteresis increases. Since the hysteresis characteristic of the current sensor deteriorates, the current cannot be detected accurately.

SUMMARY

Thus, a need exists for a current sensor which is not suspectable to the drawback mentioned above.

According to an aspect of this disclosure, a current sensor includes: a core formed by U-shaped flat plates made of a magnetic body and stacked together; a flat plate-like conductor which is inserted on an interior side of a U-groove of the core and through which a current to be measured flows; a detection element which is arranged on the side of an opening of the U-groove in such a way that a detecting direction extends in a spacing direction of the opening, and which detects a strength of a magnetic field; a housing which supports the core, the conductor and the detection element; and a pair of spacing direction supporting portions which are provided at positions along the spacing direction on both sides of the detection element, in an opening-side end of the core, and which abut on the housing.

According to such a configuration, the core can be supported by the housing via the pair of spacing direction supporting portions provided at the position on the outer side of the detection element in the spacing direction, in the core. Therefore, the detection element can be accurately positioned with respect to the core, and a compressive strain generated in the core in the manufacturing process can be reduced. Also, in the spacing direction, the core is mainly supported by the spacing direction supporting portions, and many other parts than the spacing direction supporting portions can be prevented from contacting the housing. Therefore, a compressive strain of the core along the spacing direction can be reduced. Thus, an increase in the hysteresis of the core can be restrained and therefore deterioration in the hysteresis characteristic of the current sensor can be restrained.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Hereinafter, an embodiment disclosed here will be described in detail. A current sensor 100 according to the embodiment disclosed here is configured to be capable of measuring a current to be measured flowing through a conductor 20, while restraining deterioration of the magnetic characteristic of a core 10. Here, when a current flows through the conductor 20, a magnetic field about the conductor 20 as an axial core is generated according to the magnitude of the current (Ampere's right hand rule). The current sensor 100 detects magnetic flux density in such a magnetic field, and measures the current (current value) flowing through the conductor 20, based on the detected magnetic flux density.

Figure 1:
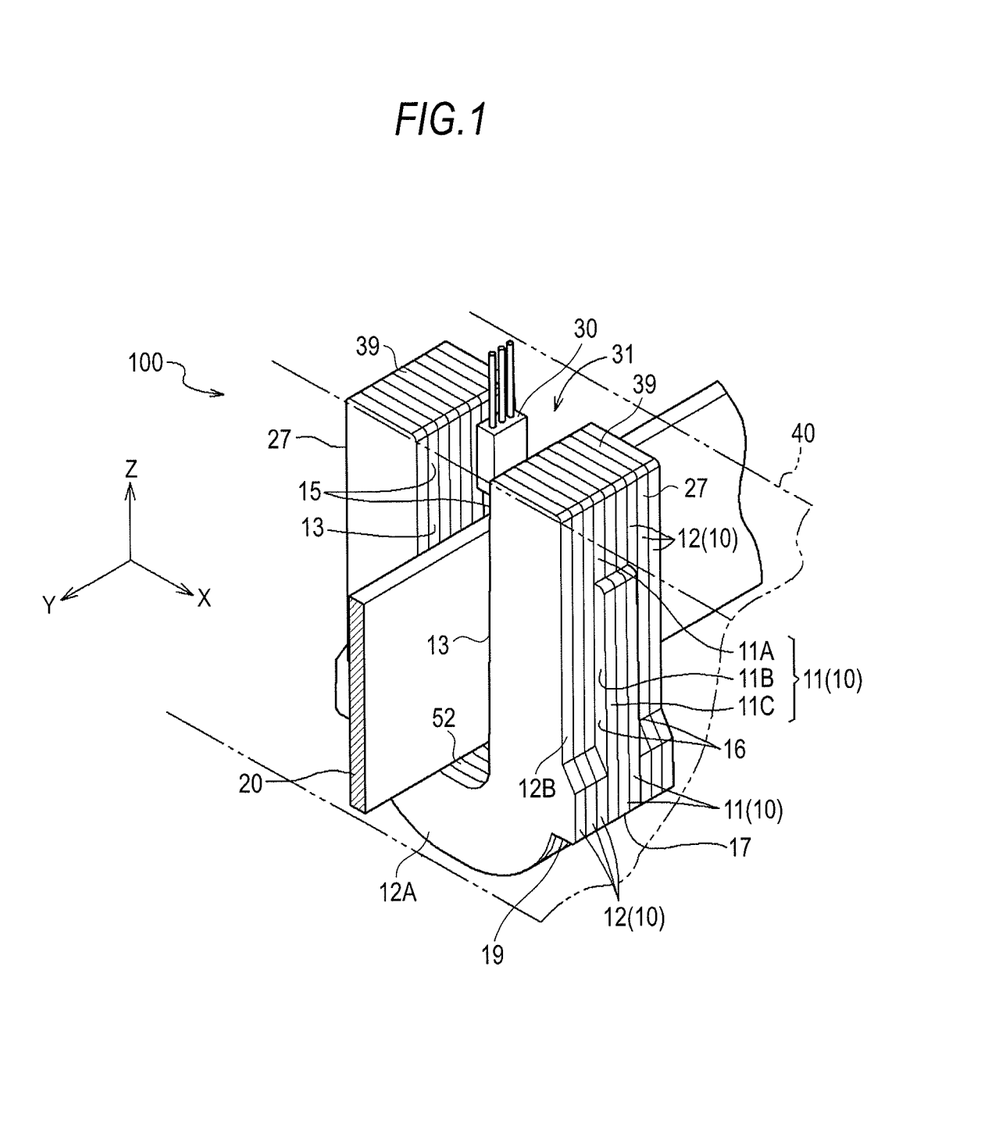
FIG. 1 is a perspective view schematically showing a current sensor.
Figure 2:
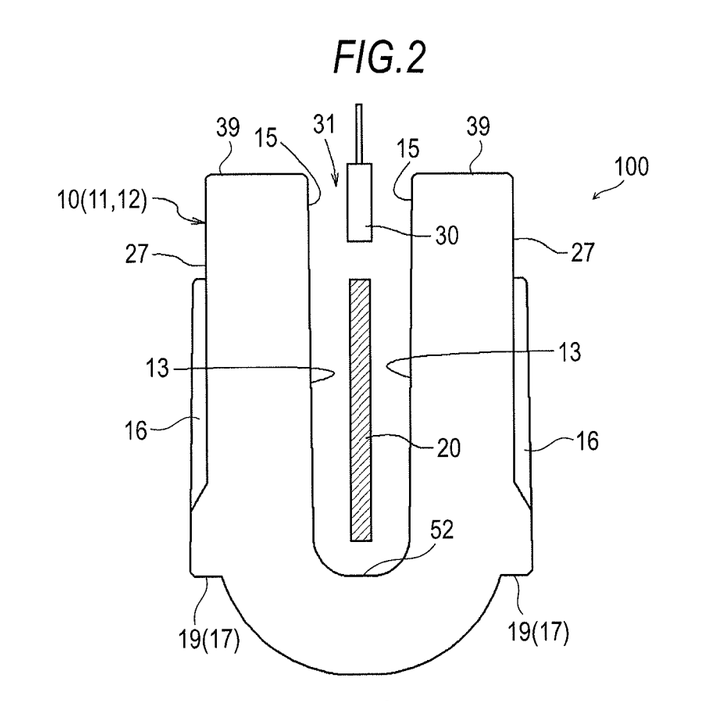
FIG. 2 is a front view schematically showing the current sensor.

FIG. 1 shows a perspective view of the current sensor 100 according to this embodiment. In FIG. 1, the flat plate-like conductor 20 is shown. Hereinafter, to facilitate understanding, the direction of thickness of the conductor 20 is referred to as X, the direction in which the conductor 20 extends (extending direction) is referred to as Y, and the direction of width of the conductor 20 is referred to as Z. FIG. 2 schematically shows the current sensor 100 as viewed in the Y direction of the conductor 20.

The current sensor 100 includes the core 10, the conductor 20, a detection element 30, and a housing 40. The core 10 is formed by stacking U-shaped flat plates made of a metal magnetic body. The metal magnetic body is a soft magnetic metal such as an electromagnetic steel plate (silicon steel plate), permalloy, or permendur. A flat plate of such a metal magnetic body is punched out into U-shaped plates and these plates are stacked together to form the core 10.

Figure 3:
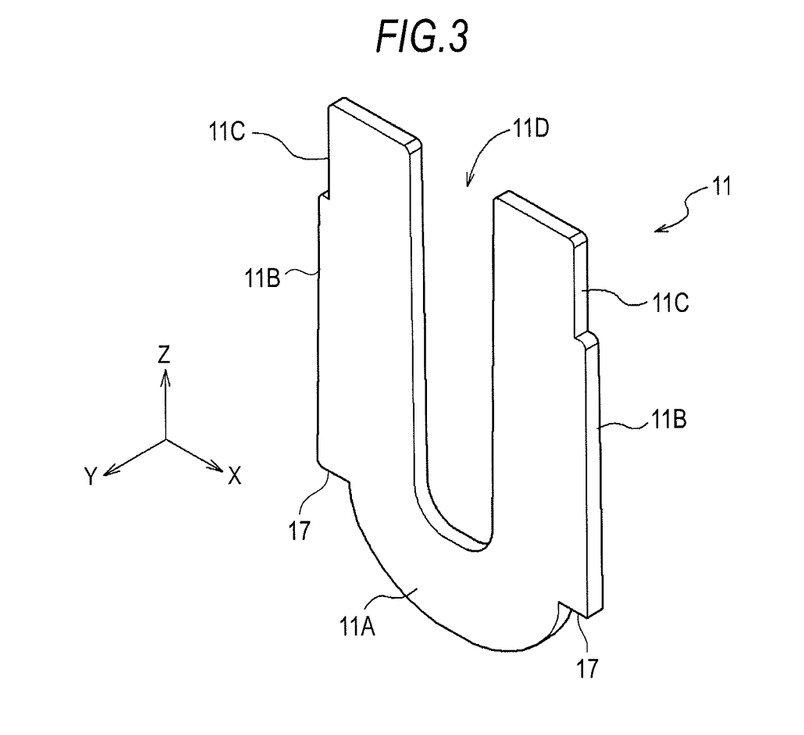
FIG. 3 is a perspective view schematically showing a first flat plate.
Figure 4:
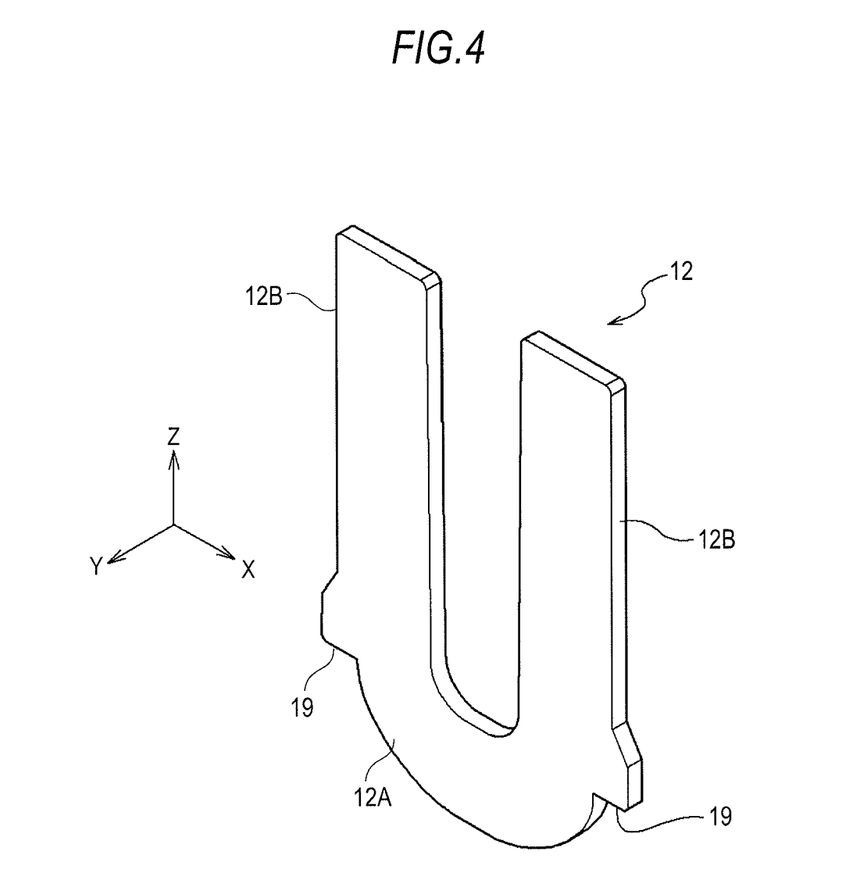
FIG. 4 is a perspective view schematically showing a second flat plate.

In this embodiment, the core 10 is formed by a first flat plate 11 and a second flat plate 12 stacked together. In this embodiment, plural first flat plates 11 and plural second flat plates 12 are used. FIG. 3 shows a perspective view of the first flat plate 11. FIG. 4 shows a perspective view of the second flat plate 12.

As shown in FIG. 3, the first flat plate 11 has a U-shaped portion 11A, and a protruding portion 11B protruding along a spacing direction from a lateral surface of the U-shaped portion 11A. The U-shaped portion 11A is a portion formed in a U-shape as viewed from the front, of the first flat plate 11. The lateral surface of the U-shaped portion 11A is a lateral surface 110 (a surface in the direction of thickness) of the U-shaped portion 11A. The spacing direction is a direction of spacing of an opening 11D of a U-groove of the U-shaped portion, that is, equivalent to the X direction. Therefore, the protruding portion 11B is provided protruding in the X direction from the lateral surface 11C of the U-shaped portion 11A. Particularly in this embodiment, the protruding portion 11B is provided on a surface orthogonal to the X direction (a surface parallel to a YZ plane), of the lateral surface 11C of the U-shaped portion 11A. In such a first flat plate 11, the U-shaped portion 11A and the protruding portion 11B are integrally punched out of a metal magnetic body.

As shown in FIG. 4, the second flat plate 12 has a U-shaped portion 12A with the same shape as the U-shaped portion 11A. Having the same shape as the U-shaped portion 11A means that the two U-shaped portions have the same outer dimension and that the U-shaped portion 11A of the first flat plate 11 and the U-shaped portion 12A of the second flat plate 12 coincide with each other as viewed in the Y direction when the first flat plate 11 and the second flat plate 12 are stacked together.

Back to FIG. 1, in this embodiment, the first flat plate 11 and the second flat plate 12 are stacked together in such a way that the first flat plate 11 is arranged toward the center in a stacking direction, with the two U-shaped portions 11A, 12A coinciding with each other. Stacking surfaces of the first flat plate 11 and the second flat plate 12 are parallel to an XZ plane. The stacking direction is equivalent to the Y direction. Therefore, the center in the stacking direction means the center in the Y direction. Thus, stacking these plates in such a way that the first flat plate 11 is arranged toward the center in the stacking direction means stacking these plates with the second flat plate 12 arranged on both sides of the first flat plate 11 in the staking direction. That is, as shown in FIG. 1, the second flat plate 12 is not arranged more toward the center in the stacking direction than the first flat plate 11, and these plates are stacked in the form of the second flat plate 12, the first flat plate 11, and the second flat plate 12, when the core 10 is viewed as a whole.

The conductor 20 is given a current to be measured that flows through the conductor 20, and the conductor 20 is formed in the shape of a flat plate. The current to be measured is a current as a detection target to be detected by the current sensor 100. The conductor 20 is formed as a long strip with a predetermined width. Such a conductor 20 is inserted on the interior side of the U-groove of the core 10. That is, the conductor 20 according to this embodiment is inserted on the side of a bottom part 52 of the U-groove, where the core 10 forms a U-shape, in such a way that a pair of surfaces parallel to the YZ plane of the conductor 20 and surfaces of U-groove sidewalls 13 of the core 10 are parallel to each other and that the stacking direction of the core 10 (Y direction) and the flowing direction of the current to be measured coincide with each other, as shown in FIGS. 1 and 2. The conductor 20 inserted in the core 10 is arranged away at least from the inner surface (U-groove sidewalls 13) of the core 10. Thus, the core 10 and the conductor 20 can be insulated from each other.

Such a conductor 20 is connected in series to a busbar that connects a three-phase motor, not shown, and an inverter electrifying the three-phase motor. The three-phase motor is used as a power source for a hybrid vehicle, electric vehicle or the like.

Figure 5:
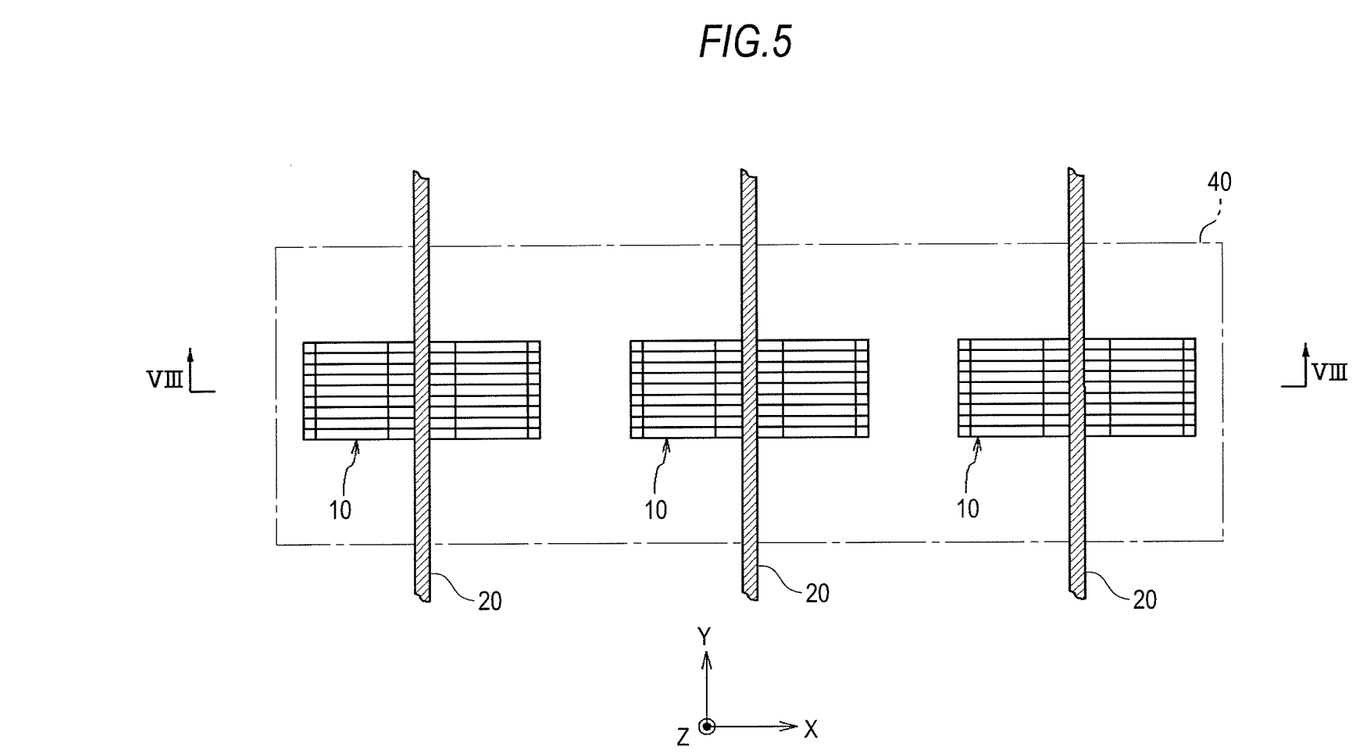
FIG. 5 schematically shows an example where the current sensor is arranged on a busbar provided in parallel.
Figure 6:
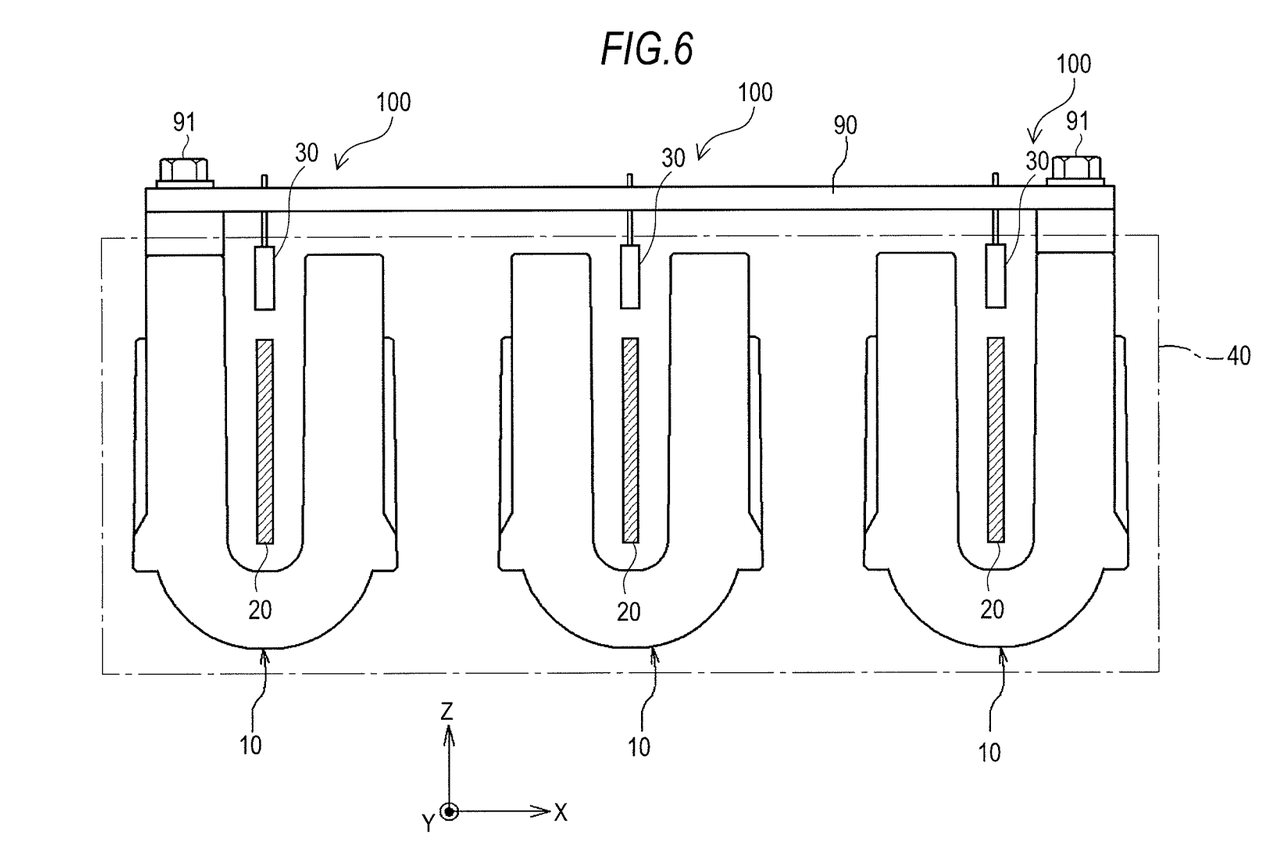
FIG. 6 schematically shows an example where the current sensor is arranged on the busbar provided in parallel.

Thus, at least three conductors 20 are arranged in parallel along a direction parallel to the thickness of the conductor 20 (X direction). Such a state where plural conductors 20 are provided in parallel is shown in FIGS. 5 and 6. FIG. 5 is a schematic view as viewed in the Z direction. FIG. 6 is a schematic view as viewed in the Y direction. However, in FIGS. 1 and 2, only one conductor 20 is shown in order to facilitate understanding.

Back to FIGS. 1 and 2, the detection element 30 is arranged on the side of an opening 31 of the U-groove of the core 10 in such a way that a detecting direction extends in the spacing direction of the opening 31 (X direction). The opening 31 is an opening end of the U-groove. Therefore, the detection element 30 is arranged on the side closer to the opening end of the U-groove than the conductor 20 is. Also, there is a gap between the detection element 30 and the conductor 20 arranged in the U-groove of the core 10. That is, the detection element 30 and the conductor 20 are spaced away from each other. Therefore, the detection element 30 and the conductor 20 can be insulated from each other. Here, in the core 10, a magnetic field generated according to the current flowing through the conductor 20 is concentrated. Near where the detection element 30 is arranged, the concentrated magnetic field is a magnetic field in the spacing direction of the opening 31 of the core 10 (X direction).

The detection element 30 is arranged in such a way that the detecting direction coincides with the X direction. Therefore, the detection element 30 can effectively detect the strength of the magnetic field formed by the current to be measured flowing through the conductor 20.

As shown in FIGS. 5 and 6, the housing 4 supports the core 10, the conductor 20 and the detection element 30. In this embodiment, the housing 40 is formed by resin molding and integrally molded with the conductor 20. The detection element 30 is fixed to a substrate 90 with solder. The substrate 90 is fastened to the housing 40, for example, with a bolt 91. The conductor 20 and the detection element 30 are thus supported in the housing 40.

Now, if a stress (for example, compressive strain) is generated on a magnetic body, the hysteresis thereof increases according to the stress. In the case where a magnetic body is used for the core 10 of the current sensor 100 as in the embodiment disclosed here, it is desirable that the hysteresis is small. Thus, the core 10 of the current sensor 100 is supported by the housing 40 so that any stress is less likely to occur.

Figure 7:
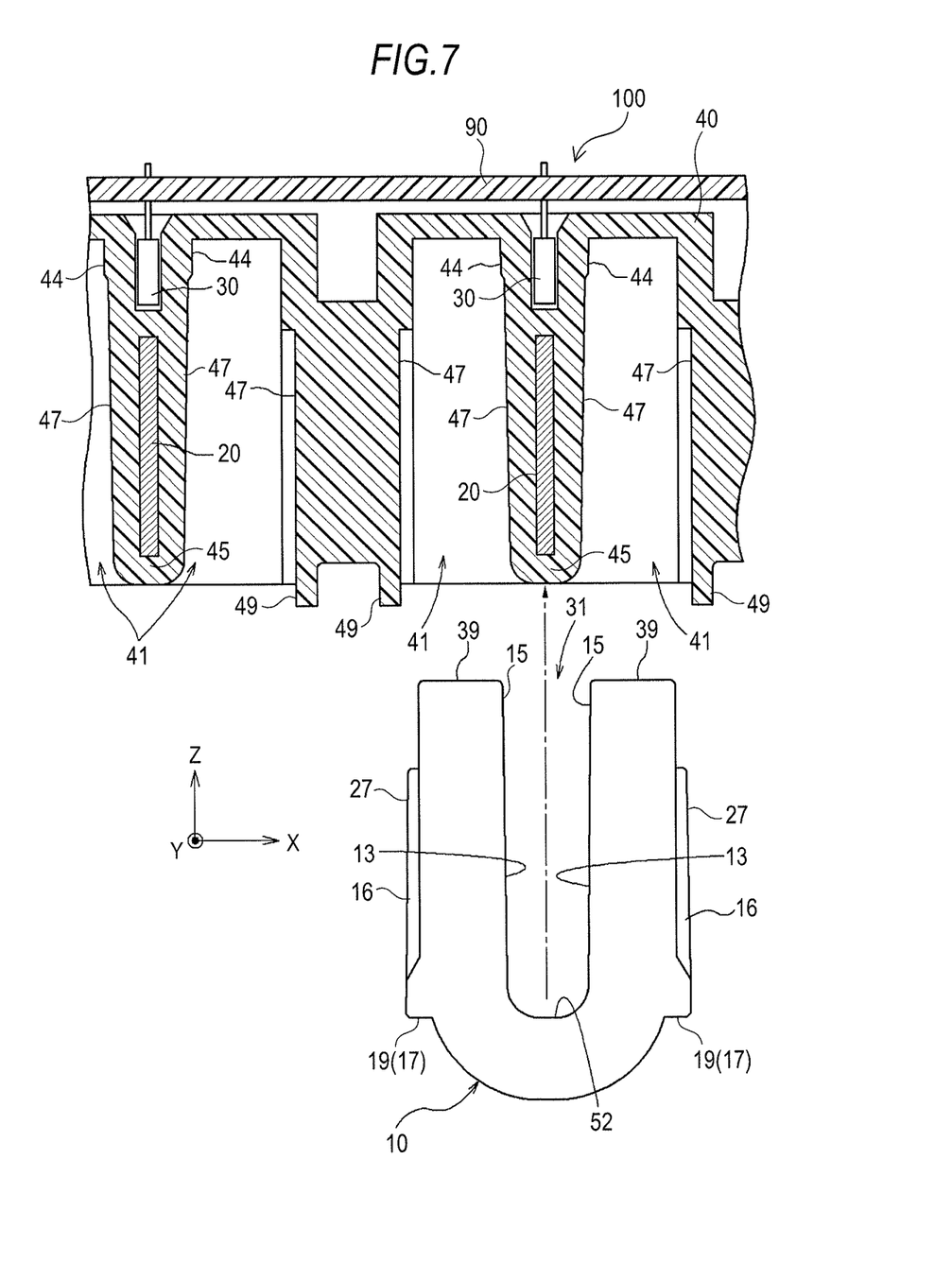
FIG. 7 shows the state before a core is inserted in a hole part of a housing.
Figure 8:
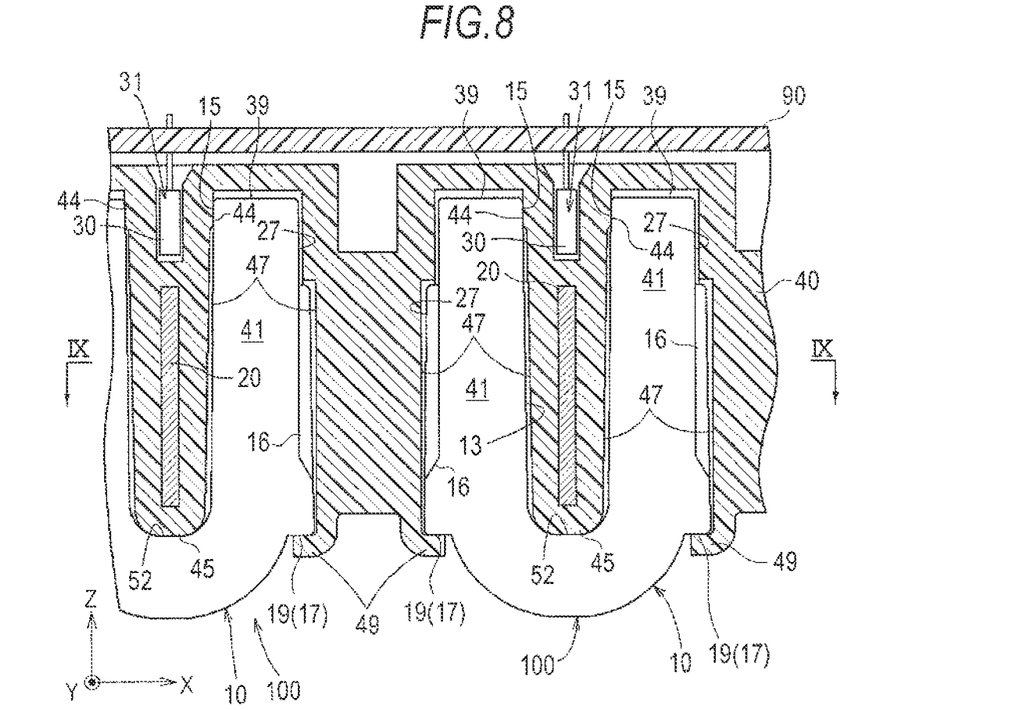
FIG. 8 shows the state after the core is inserted in the hole part of the housing.

As described above, the core 10 is formed in a U-shape. As shown in FIG. 7, in the housing 40, a hole portion 41 in which the core 10 can be inserted from the side of the opening 31 of the U-shape is formed. As shown in FIG. 8, the core 10 is inserted in the hole portion 41 up to the bottom part 52 of the U-groove and thus assembled. That is, in this embodiment, the core 10 is not fixed to the housing 40 through resin molding, for example, by insert molding.

At positions along the spacing direction on both sides of the detection element 30, on opening side ends of the core 10, a pair of spacing direction supporting portions 15 abutting on the housing 40 are provided. The core 10 includes both the first flat plate 11 and the second flat plate 12. The opening side ends are the ends of the U-groove on the side of the opening 31. The spacing direction is the spacing direction of the U-groove and is equivalent to the X direction. Therefore, the positions along the spacing direction on both sides of the detection element 30 are equivalent to parts of the U-groove sidewalls 13 of the core 10 that face the detection element 30 and parts of the outer walls of the core 10 that correspond to the outer side of the parts of the U-groove sidewalls 13, in the state where the core 10 is arranged in the housing 40 in such a way that the core 10 faces the detection element 30 from both sides.

In this embodiment, the spacing direction supporting portions 15 are provided at positions facing the detection element 30, on the inner side of the U-groove of the core 10. In this embodiment, such spacing direction supporting portions 15 are provided to face each other in the spacing direction (X direction) on the U-groove sidewalls 13 of the core 10. When such a core 10 is inserted into the hole portion 41 of the housing 40, a part of the housing 40 (hereinafter referred to as a "entry portion 45") enters the U-groove from the side of the opening 31. The entry portion 45, thus entering the U-groove, may be preferably formed in a tapered shape when viewed in the Y direction so that the distal end side of the entry is narrower while the proximal side is broader (see FIG. 7). On the entry portion 45, a protruding portion 44 protruding in the spacing direction (X direction) from the entry portion 45 is provided at positions abutting on the spacing direction supporting portions 15 when the core 10 is inserted in the hole portion 41. The amount of protrusion of such a protruding portion 44 may be very small, for example, several hundred times smaller or several thousand times smaller than the spacing of the U-groove. Thus, when the core 10 is inserted in the hole portion 41 of the housing 40, the entry portion 45 as a part of the housing 40 entering from the side of the opening 31 can be held in-between with an increased supporting force of the spacing direction supporting portions 15 to the housing 40.

Meanwhile, the dimension of the hole portion 41 may be preferably set in such a way that an outer surface 27 of the U-groove of the core 10 does not contact a surface 47 facing the side of the spacing direction (X direction) of the hole portion 41 of the housing 40 (see FIG. 8). Thus, the core 10 can be supported in the spacing direction (X direction) with respect to the housing 40 simply by the spacing direction supporting portions 15. Therefore, the core 10 can be positioned with reference to the detection element 30, while reducing a compressive strain generated in the core 10.

Figure 9:
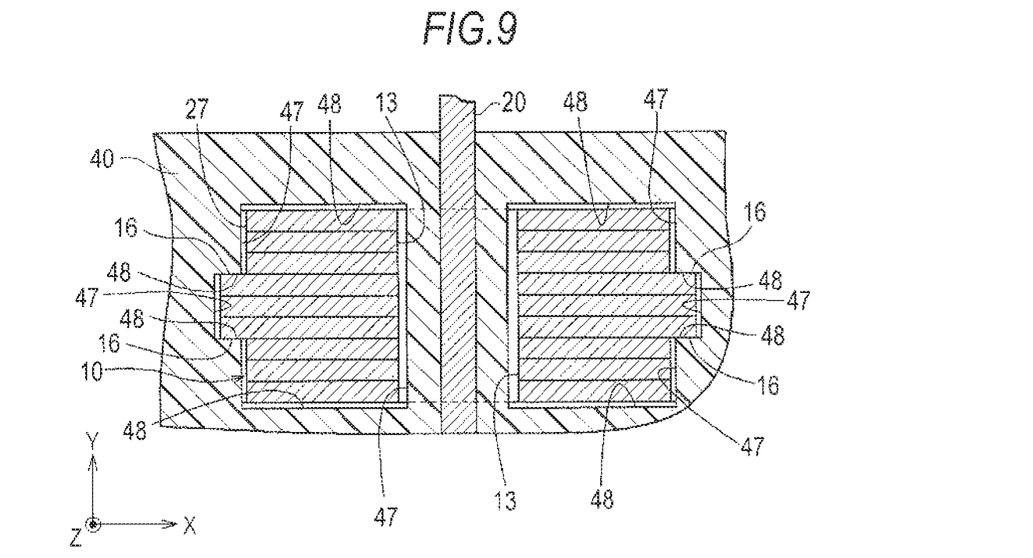
FIG. 9 is a cross-sectional view taken along IX-IX in FIG. 8.

In this embodiment, on the protruding portion 11B of the first flat plate 11, a stacking direction supporting portion 16 supported by the housing 40 from both sides in the stacking direction of the first flat plate 11 and the second flat plate 12 is provided. The stacking direction of the first flat plate 11 and the second flat plate 12 is the Y direction. FIG. 9 shows a cross-sectional view taken along IX-IX in FIG. 8. In this embodiment, the protruding portion 11B is provided only on the first flat plate 11 arranged toward the center in the stacking direction, as shown in FIG. 9. Therefore, a surface 48 facing the side of the Y direction of the hole portion 41 of the housing 40 may be preferably set not to contact the other parts than the stacking direction supporting portion 16, that is, the protruding portion 11B of the first flat plate 11. Thus, the core 10 can be supported from both sides in the Y direction only in the stacking direction supporting portions 16, and therefore a compressive strain can be prevented from being generated in the U-shape part of the core 10.

Here, in this embodiment, the entry portion 45 enters the U-groove of the core 10 as the core 10 is inserted in the hole portion 41 of the housing 40 as described above. A part of the housing 40 that enters from the side of the opening 31, that is, the entry portion 45, abuts on the bottom part 52 of the U-groove. Therefore, the core 10 can be inserted into the hole portion 41 to the position where the bottom part 52 of the U-groove abuts on the entry portion 45. Thus, the spacing direction supporting portions 15 and the stacking direction supporting portions 16 are configured to function in the state where the entry portion 45 entering from the side of the opening 31 abuts on the bottom part 52 of the U-groove of the core 10.

Also, an opening direction supporting portion 17 on which the housing 40 abuts from the side opposite to the side of the opening 31 and which is thus supported along the opening direction of the U-groove is provided at a shoulder portion provided at a position on the interior side of the opening, on the protruding portion 11B. The position on the interior side of the opening, on the protruding portion 11B, is the position on the curving side of the U-shaped portion on the protruding portion 11B of the first flat plate 11. The opening direction supporting portion 17 is provided on the shoulder portion at this position, that is, the surface in the direction of thickness of the first flat plate 11 (the outer surface 27 of the U-groove of the core 10). The side opposite to the side of the opening 31 is equivalent to the curving side of the U-shaped portion.

Here, in this embodiment, an opening direction supporting portion 19 is provided also on a lateral surface 12B of the U-shaped portion of the second flat plate 12 in such a way as to coincide with the opening direction supporting portion 17 of the first flat plate 11 in the stacking direction when the first flat plate 11 and the second flat plate 12 are stacked together. That is, as shown in FIGS. 1 and 2, when the core 10 is formed using the first flat plate 11 and the second flat plate 12, the opening direction supporting portion 19 of the second flat plate 12 is provided in such a way as to coincide with the opening direction supporting portion 17 of the first flat plate 11 as viewed in the Y direction. A supporting portion 49 of the housing 40 abuts on the opening direction supporting portion 17 of the first flat plate 11 and the opening direction supporting portion 19 of the second flat plate 12 from the curving side.

The supporting portion 49 may preferably stand straight from the housing 40 as shown in FIG. 7 before the core 10 is inserted in the hole portion 41, and then bend toward and support the opening direction supporting portion 17 and the opening direction supporting portion 19 by heat caulking or the like after the core 10 is inserted in the hole portion 41 as shown in FIG. 8. Of course, the opening direction supporting portion 17 and the opening direction supporting portion 19 may be supported by a lid member or may be supported by potting, instead of heat caulking.

In this embodiment the shoulder portion where the opening direction supporting portion 17 is provided and the shoulder portion where the opening direction supporting portion 19 is provided are configured to coincide with the bottom part 52 of the U-groove along the spacing direction. Coinciding along the spacing direction refers to the state where the bottom part 52, the opening direction supporting portion 17 and the opening direction supporting portion 19 are arrayed in the X direction and where the position of the bottom part 52 in the Z direction coincides with the positions of the opening direction supporting portion 17 and the opening direction supporting portion 19 in the Z direction.

As shown in FIG. 8, a distal end 39 on the side of the opening 31 of the core 10 is provided away from the housing 40. The distal end 39 on the side of the opening 31 of the core 10 is a surface facing the interior side of the hole portion 41 when the core 10 is inserted in the hole portion 41 of the housing 40. This surface is configured to be spaced away from the housing 40, that is, to float, when the core 10 is inserted in the hole portion 41. With such a configuration, the core 10 can be supported in the opening direction simply by the bottom part 52, the opening direction supporting portion 17 and the opening direction supporting portion 19. Also, since the bottom part 52, the opening direction supporting portion 17 and the opening direction supporting portion 19 are situated at the same position in the opening direction and therefore do not have any mutually acting moment, generation of a compressive strain in the U-shaped portion of the core 10 can be prevented.

Other Embodiments

In the above embodiment, it is described that the protruding portion 44 protruding along the spacing direction is provided on the entry portion 45 of the housing 40. However, the range of application of the technique disclosed here is not limited to this embodiment. Of course, It is possible to form the entry portion 45 without providing the protruding portion 44 on the entry portion 45. Even in such a case, since the entry portion 45 is tapered, the core 10 can be supported on the entry portion 45 by the spacing direction supporting portions 15 of the core 10.

The spacing direction supporting portions 15 can also be provided to protrude in the spacing direction (X direction) from the U-groove sidewalls 13 of the core 10. The amount of such protrusion may be very small, for example, several hundred times smaller or several thousand times smaller than the spacing of the U-groove. In such a case, the protruding portion 44 need not be provided on the entry portion 45. Even with such a configuration, of course, the core 10 can be supported to the housing 40 by the spacing direction supporting portions 15.

Moreover, the spacing direction supporting portions 15 can also be configured to protrude outward along the X direction from the outer surface 27 of the U-groove of the core 10, at positions along the spacing direction on both sides of the detection element 30. In such a case, the spacing direction supporting portions 15 abut on the hole portion 41 of the housing 40, on the outer surface 27 of the U-groove of the core 10, and the U-groove sidewalls 13 can be prevented from contacting the hole portion 41. Therefore, a compressive strain generated in the U-shaped portion of the core 10 can be reduced and an increase in the hysteresis of the core 10 can be restrained. Thus, deterioration in the hysteresis characteristic of the current sensor 100 can be prevented.

In the above embodiment, it is described that the core 10 is supported in the spacing direction (X direction) by the spacing direction supporting portions 15, supported in the stacking direction (Y direction) by the stacking direction supporting portions 16, and supported in the opening direction (Z direction) by the bottom part 52 and the opening direction supporting portions 17. However, the range of application of the technique disclosed here is not limited to this embodiment. The core 10 can also be configured to be supported only in the spacing direction (X direction). In such a case, the core 10 can be formed using the second flat plate 12 only, that is, using a flat plate without having the protruding portion 11B.

Also, the core 10 can be configured to be supported in the spacing direction (X direction) and the stacking direction (Y direction) and not to be supported in the opening direction (Z direction). Moreover, the core 10 can be configured to be supported in the spacing direction (X direction) and the opening direction (Z direction) and not to be supported in the stacking direction (Y direction).

In the above embodiment, it is described that the first flat plate 11 and the second flat plate 12 are stacked together in the order of the second flat plate 12, the first flat plate 11 and the second flat plate 12 when the core 10 is viewed in the Z direction. However, the range of application of the technique disclosed here is not limited to this embodiment. Of course, the first flat plate 11 and the second flat plate 12 can be stacked together in the order of the second flat plate 12 and the first flat plate 11 when the core 10 is viewed in the Z direction.

In the above embodiment, it is described that the surface 48 facing the side of the Y direction of the hole portion 41 of the housing 40 may be preferably set not to contact the other parts than the stacking direction supporting portions 16. However, in such a configuration, it is preferable, for example, that the spacing between surfaces facing the sides of the stacking direction supporting portions 16, of the hole portion 41, is broader as it goes to the opening side of the hole portion 41 and narrower as it goes toward the interior side of the opening. Thus, the stacking direction supporting portions 16 can be supported securely along the Y direction.

In the above embodiment, it is described that the positions of the bottom part 52 and the opening direction supporting portion 17 coincide with each other along the spacing direction, when supporting the core 10 in the opening direction. However, the range of application of the technique disclosed here is not limited to this embodiment. If the positions of the bottom part 52 and the opening direction supporting portion 17 are substantially the same along the spacing direction, the moment acting on the core 10 is small. Therefore, even in such a case, the stress on the core 10 can be reduced. Thus, of course, deterioration in the hysteresis characteristic of the current sensor 100 can be reduced.

Also, for example, the housing 40 can be formed in such a way that a portion having a Z-direction position coinciding with the entry portion 45 is provided on the outer side of the U-groove of the core 10, and another member extending from this portion (for example, a member with a small coefficient of thermal expansion) can be used to support the core 10 of the U-groove facing the entry portion 45. Even in such a case, the core 10 can be supported while the moment in the Z direction acting on the core 10 is reduced.

In the above embodiment, it is described that the opening direction supporting portion 19 is provided on the lateral surface 12B of the second flat plate 12. However, the range of application of the technique disclosed here is not limited to this embodiment. Of course, the core 10 can be formed without providing the opening direction supporting portion 19 on the second flat plate 12. Even in such a case, the core can be supported in the opening direction by the opening direction supporting portion 17 on the first flat plate 11.

The technique disclosed here can be used for a current sensor that measures a current flowing through a conductor.

According to an aspect disclosed here, a current sensor includes: a core formed by U-shaped flat plates made of a magnetic body and stacked together; a flat plate-like conductor which is inserted on an interior side of a U-groove of the core and through which a current to be measured flows; a detection element which is arranged on the side of an opening of the U-groove in such a way that a detecting direction extends in a spacing direction of the opening, and which detects a strength of a magnetic field; a housing which supports the core, the conductor and the detection element; and a pair of spacing direction supporting portions which are provided at positions along the spacing direction on both sides of the detection element, in an opening-side end of the core, and which abut on the housing.

According to such a configuration, the core can be supported by the housing via the pair of spacing direction supporting portions provided at the position on the outer side of the detection element in the spacing direction, in the core. Therefore, the detection element can be accurately positioned with respect to the core, and a compressive strain generated in the core in the manufacturing process can be reduced. Also, in the spacing direction, the core is mainly supported by the spacing direction supporting portions, and many other parts than the spacing direction supporting portions can be prevented from contacting the housing. Therefore, a compressive strain of the core along the spacing direction can be reduced. Thus, an increase in the hysteresis of the core can be restrained and therefore deterioration in the hysteresis characteristic of the current sensor can be restrained.

It is preferable that the spacing direction supporting portions are provided at positions facing the detection element on an inner side of the U-groove, in the core, and hold the housing between the spacing direction supporting portions.

According to such a configuration, the detection element can be held in-between via the housing. Therefore, the space between the core and the detection element can be kept constant. Thus, since the space between the core and the detection element remains unchanged, desired detection accuracy can be maintained.

It is preferable that, in the core, a first flat plate having a U-shaped portion and a protruding portion protruding along the spacing direction from a lateral surface of the U-shaped portion, and a second flat plate having a U-shaped portion with the same shape as the U-shaped portion of the first flat plate are stacked in such a way that the first flat plate is arranged toward a center in a stacking direction, with the U-shaped portions coinciding with each other, and that a stacking direction supporting portion supported by the housing from both sides in the stacking direction of the first flat plate and the second flat plate is provided on the protruding portion.

According to such a configuration, the core can be supported in the stacking direction simply by the stacking direction supporting portion provided on the protruding portion protruding from the U-shaped portion. Therefore, in the stacking direction, the core can be supported simply by the protruding portion and the other parts than the protruding portion can be prevented from contacting the housing. Thus, a compressive strain in the stacking direction generated in the core can be reduced. As an increase in the hysteresis of the core can be prevented, deterioration in the hysteresis characteristic of the current sensor can be restrained.

It is preferable that, in the core, a first flat plate having a U-shaped portion and a protruding portion protruding along the spacing direction from a lateral surface of the U-shaped portion, and a second flat plate having a U-shaped portion with the same shape as the U-shaped portion of the first flat plate are stacked in such a way that the first flat plate is arranged toward a center in a stacking direction, with the U-shaped portions coinciding with each other, and that a portion of the housing that enters from the side of the opening abuts on a bottom part of the U-groove, and that an opening direction supporting portion on which the housing abuts from a side opposite to the side of the opening and which is thus supported along an opening direction of the U-groove is provided at a shoulder portion which is provided on the protruding portion at a position on the interior side of the opening, and coincides with the bottom part along the spacing direction, and a distal end on the side of the opening of the core is spaced away from the housing.

According to such a configuration, the core can be supported in the opening direction by the bottom part of the U-shaped portion and the opening direction supporting portion. Also, the bottom part and the opening direction supporting portion are at the same position in the opening direction, and the opening direction supporting portion is provided on both sides of the bottom part. Therefore, mutually acting moment can be eliminated. Moreover, since the distal end of the core is spaced away from the housing, the core can be supported in the opening direction simply by the bottom part of the U-shaped portion and the opening direction supporting portion, and the other parts than the bottom part and the opening direction supporting portion can be prevented from contacting the housing. Therefore, a compressive strain in the opening direction generated in the core can be reduced. Thus, as an increase in the hysteresis of the core can be prevented, deterioration in the hysteresis characteristic of the current sensor can be restrained.

It is preferable that an opening direction supporting portion is provided also on a lateral surface of the U-shaped portion of the second flat plate in such a way as to coincide with the opening direction supporting portion of the first flat plate, in the stacking direction, when the first flat plate and the second flat plate are stacked together.

According to such a configuration, the core can be supported in the opening direction by both the first flat plate and the second flat plate. Therefore, the core can be supported in the opening direction more securely.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A current sensor comprising:
a core formed by U-shaped flat plates made of a magnetic body and stacked together;
a flat plate-like conductor which is inserted on an interior side of a U-groove of the core and through which a current to be measured flows;
a detection element which is arranged on the side of an opening of the U-groove in such a way that a detecting direction extends in a spacing direction of the opening, and which detects a strength of a magnetic field;
a housing which supports the core, the conductor and the detection element; and
a pair of spacing direction supporting portions which are provided at positions along the spacing direction on both sides of the detection element, in an opening-side end of the core, and which abut on the housing;
wherein in the core, a first flat plate having a U-shaped portion and a protruding portion protruding along the spacing direction from a lateral surface of the U-shaped portion, and a second flat plate having a U-shaped portion with the same shape as the U-shaped portion of the first flat plate are stacked in such a way that the first flat plate is arranged toward a center in a stacking direction, with the U-shaped portions coinciding with each other, and a portion of the housing that enters from the side of the opening abuts on a bottom part of the U-groove, and an opening direction supporting portion on which the housing abuts from a side opposite to the side of the opening and which is thus supported along an opening direction of the U-groove is provided at a shoulder portion which is provided on the protruding portion at a position on the interior side of the opening and coincides with the bottom part along the spacing direction, and a distal end on the side of the opening of the core is spaced away from the housing.

2. The current sensor according to claim 1, wherein the spacing direction supporting portions are provided at positions facing the detection element on an inner side of the U-groove, in the core, and hold the housing between the spacing direction supporting portions.

3. The current sensor according to claim 1, wherein in the core, a first flat plate having a U-shaped portion and a protruding portion protruding along the spacing direction from a lateral surface of the U-shaped portion, and a second flat plate having a U-shaped portion with the same shape as the U-shaped portion of the first flat plate are stacked in such a way that the first flat plate is arranged toward a center in a stacking direction, with the U-shaped portions coinciding with each other, and a stacking direction supporting portion supported by the housing from both sides in the stacking direction of the first flat plate and the second flat plate is provided on the protruding portion.

4. The current sensor according to claim 1, wherein an opening direction supporting portion is provided also on a lateral surface of the U-shaped portion of the second flat plate in such a way as to coincide with the opening direction supporting portion of the first flat plate, in the stacking direction, when the first flat plate and the second flat plate are stacked together.

5. The current sensor according to claim 2, wherein an opening direction supporting portion is provided also on a lateral surface of the U-shaped portion of the second flat plate in such a way as to coincide with the opening direction supporting portion of the first flat plate, in the stacking direction, when the first flat plate and the second flat plate are stacked together.

6. The current sensor according to claim 3, wherein an opening direction supporting portion is provided also on a lateral surface of the U-shaped portion of the second flat plate in such a way as to coincide with the opening direction supporting portion of the first flat plate, in the stacking direction, when the first flat plate and the second flat plate are stacked together.

* * * * *